United States Patent
Yano et al.

(10) Patent No.: US 11,979,017 B2
(45) Date of Patent: May 7, 2024

(54) POWER CONVERSION DEVICE

(71) Applicant: Hitachi Astemo, Ltd., Hitachinaka (JP)

(72) Inventors: Tomohiko Yano, Tokyo (JP);
Shinichirou Wada, Tokyo (JP);
Yoichiro Kobayashi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 194 days.

(21) Appl. No.: 17/629,852

(22) PCT Filed: Jul. 13, 2020

(86) PCT No.: PCT/JP2020/027182
§ 371 (c)(1),
(2) Date: Jan. 25, 2022

(87) PCT Pub. No.: WO2021/039157
PCT Pub. Date: Mar. 4, 2021

(65) Prior Publication Data
US 2022/0321029 A1    Oct. 6, 2022

(30) Foreign Application Priority Data
Aug. 27, 2019  (JP) .................. 2019-154925

(51) Int. Cl.
*H02H 5/04* (2006.01)
(52) U.S. Cl.
CPC ............ *H02H 5/044* (2013.01); *H02H 5/042* (2013.01)
(58) Field of Classification Search
CPC ........ H02M 1/00; H02M 1/096; H02M 1/327; H02M 7/53871; H03F 3/45179; H02H 5/042; H02H 5/044
See application file for complete search history.

(56) References Cited

U.S. PATENT DOCUMENTS 5,962,912 A * 10/1999 Hierold ............... H01L 29/7803
257/341
11,728,748 B2 * 8/2023 Hain .................... H02M 7/539
307/9.1
(Continued)

FOREIGN PATENT DOCUMENTS

JP    2000-338146 A    12/2000
JP    2002-289789 A    10/2002
(Continued)

OTHER PUBLICATIONS

Extended European Search Report issued in corresponding European Patent Application No. 20857303.0, dated Jul. 25, 2023 (10 pages).
(Continued)

*Primary Examiner* — Sibin Chen
(74) *Attorney, Agent, or Firm* — Foley & Lardner LLP

(57) ABSTRACT

Provided is a novel power conversion device that enables estimation of a temperature of a power device without using a temperature sensing diode and can accurately estimate a temperature and a current of a current sensing element that observes a main current. A measurement voltage (Vref) is applied between source terminals (31*s* and 49*s*) of a main control element 31 and a current sensing element 49 in a state in which the main control element 31 and the current sensing element 49 are turned off, and a temperature of a power device 30 is estimated from a current (Ib) flowing between the source terminals (31*s* and 49*s*) of the main control element 31 and the current sensing element 49 at the time of the application by using the fact that a resistance value of a semiconductor substrate between the source terminals of the main control element 31 and the current sensing element 49 has temperature dependency.

16 Claims, 11 Drawing Sheets

(56) References Cited

U.S. PATENT DOCUMENTS

| | | | |
|---|---|---|---|
| 2002/0140447 A1 | 10/2002 | Throngnumchai | |
| 2006/0215341 A1 | 9/2006 | Sakurai | |
| 2014/0362490 A1 | 12/2014 | Maekawa | |
| 2016/0211657 A1 | 7/2016 | Hayashi | |
| 2017/0358512 A1* | 12/2017 | Kakimoto | H03K 17/08 |
| 2018/0254734 A1* | 9/2018 | Kano | B62D 5/0496 |
| 2019/0199195 A1* | 6/2019 | Akiyama | H03K 17/567 |

FOREIGN PATENT DOCUMENTS

| | | |
|---|---|---|
| JP | 2006-271098 A | 10/2006 |
| JP | 2011-142700 A | 7/2011 |
| JP | 2014-241672 A | 12/2014 |
| JP | 2016-225695 A | 12/2016 |
| WO | WO-2015/033449 A1 | 3/2015 |

OTHER PUBLICATIONS

International Search Report with English translation and Written Opinion issued in corresponding application No. PCT/JP2020/027182 dated Oct. 13, 2020.

* cited by examiner

POWER CONVERSION DEVICE

TECHNICAL FIELD

The present invention relates to a power conversion device including a power device such as an insulated-gate bipolar transistor (IGBT) or a metal-oxide-semiconductor field-effect transistor (MOSFET), and particularly relates to a power conversion device that requires highly accurate current measurement.

BACKGROUND ART

As next-generation vehicles, a hybrid vehicle in which an internal combustion engine and an electric motor rotate driving wheels in cooperation, and an electric vehicle in which only an electric motor rotates driving wheels have attracted attention. In a vehicle motor used in these vehicles, a compact and high-torque synchronous motor in which a permanent magnet is embedded in a rotor is adopted, and a vector control is generally used to maximize the torque of the synchronous motor.

In such a vector control, a current command is calculated from a torque command generated by an accelerator command or a brake command, and a speed, and a pulse width modulation (PWM) signal is generated based on the current command to drive a power device of an inverter. Further, a vector control requires a current sensor for measuring an output current of the inverter. Therefore, a current sensing element dedicated to current sensing is provided separately from a main control element of an insulated-gate bipolar transistor (IGBT) or a metal-oxide-semiconductor field-effect transistor (MOSFET) implementing the power device, and a current flowing through the current sensing element is sensed to estimate a main current flowing through the main control element. Such a power conversion circuit is well known as disclosed in, for example, JP 2006-271098 A (PTL 1).

By the way, since the power device including the current sensing element and the main control element described above has temperature dependency, there is a problem that a sense current characteristic fluctuates depending on a temperature and accurate current measurement cannot be made. Therefore, a temperature sensing diode is formed on a semiconductor substrate included in the power device, and the current characteristic is corrected by the temperature sensing diode.

However, in a case where temperature measurement is performed using the temperature sensing diode, there is a problem that the temperature sensing diode, a wiring connected to the temperature sensing diode, and a pad for connection to an external circuit are required to be formed on the semiconductor substrate, and the area of the semiconductor substrate is thus increased accordingly, which results in an increase in product cost. Furthermore, since a process for forming the temperature sensing diode or the like on the semiconductor substrate is required, there is also a problem that a manufacturing process becomes complicated and a manufacturing cost thus increases.

For this reason, a power conversion device capable of measuring a temperature of a power device without using a temperature sensing diode has been proposed. For example, JP 2016-225695 A (PTL 2) discloses a current sensing circuit having the following configuration.

In FIG. 1 of PTL 2, a field-effect transistor (FET) and an IGBT are connected in parallel, and the IGBT is the power device implementing the main control element and the current sensing element in the present invention, and the FET is an element added for temperature sensing. An FET driver is operated to change a gate voltage of the FET while the IGBT is turned on. Here, a drain current flowing through the FET is changed according to the gate voltage, and a current sensing unit senses a collector current of the IGBT that is changed reversely to the change in the drain current of the FET. Here, since the gate voltage of the FET has temperature dependency, a temperature estimation unit can estimate a temperature of the FET based on a change characteristic of the drain current with respect to the change in the gate voltage.

CITATION LIST

Patent Literature

PTL 1: JP 2006-271098 A
PTL 2: JP 2016-225695 A

SUMMARY OF INVENTION

Technical Problem

Meanwhile, in PTL 2 described above, it is assumed that the temperature dependency of the gate voltage of the FET is used, and the temperature of the FET is observed by observing the change in the drain current at the time of turning on the FET with the IGBT and observing the gate voltage (Vth) of the FET at the moment of turning on the FET. However, the configuration is insufficient because a temperature of the IGBT that observes the original current is not considered. In addition, the current is changed for the temperature observation during an on period of the IGBT in which the current is to be measured, which shortens a current-observable period and deteriorates accuracy of the current observation.

An object of the present invention is to provide a novel power conversion device that enables observation of a temperature of a power device without using a temperature sensing diode in the power device including a current sensing element and can perform accurate estimation of a current of the power device by current sense current observation.

Solution to Problem

A first characteristic of the present invention is that a measurement voltage is applied between source terminals of a main control element and a current sensing element in a state in which the main control element and the current sensing element are turned off, and a temperature of a power device is estimated from a current flowing between the respective source terminals of the main control element and the current sensing element at the time of the application by using the fact that a resistance value of a semiconductor substrate between the source terminals of the main control element and the current sensing element has temperature dependency.

A second characteristic of the present invention is that a constant current from a constant current source is made to flow between source terminals of a main control element and a current sensing element in a state in which the main control element and the current sensing element are turned off, and a temperature of a power device is estimated from a terminal voltage between the respective source terminals of the main control element and the current sensing element at the time of the flow of the constant current by using the fact that a resistance value of a semiconductor substrate between the source terminals of the main control element and the current sensing element has temperature dependency.

Advantageous Effects of Invention

According to the present invention, in the power device including the current sensing element, it is possible to accurately estimate the temperature of the power device with a small area without using a temperature sensing diode, and current observation by the current sensing element is not hindered.

DESCRIPTION OF EMBODIMENTS

Hereinafter, embodiments of the present invention will be described in detail with reference to the drawings, but the present invention is not limited to the following embodiments, and various modifications and application examples are also included in the technical concept of the present invention.

First, a power conversion device to which the present invention is applied will be described with reference to the drawings. The power conversion device according to the present invention can be typically applied to a hybrid vehicle or an electric vehicle, but a case where the power conversion device is applied to a hybrid vehicle will be described below as an example. However, it is a matter of course that the present invention can be used not only for the power conversion device of a hybrid vehicle or an electric vehicle, but also for a power conversion device of an electric motor used for other industrial equipment.

Figure 1:
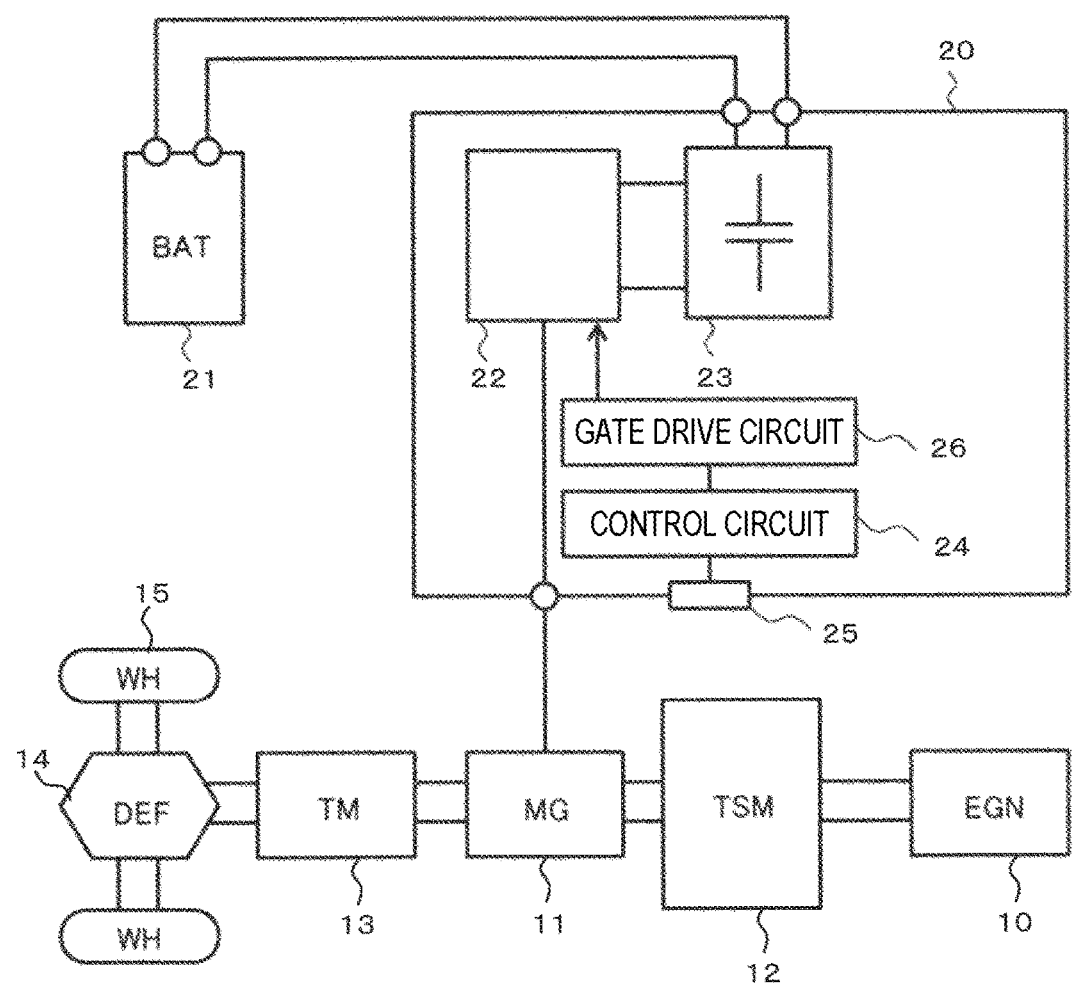
FIG. 1 is a configuration diagram illustrating a system configuration of a hybrid vehicle.

FIG. 1 illustrates a system configuration of a hybrid vehicle, and an internal combustion engine 10 and a motor generator 11 are power sources that generate a traveling torque of the vehicle. Further, the motor generator 11 not only generates a rotational torque as an electric motor, but also has a power generation function of converting mechanical energy (rotational force) applied to the motor generator 11 into electric power. The motor generator 11 is operated as both an electric motor and a generator according to a vehicle driving method.

An output of the internal combustion engine 10 is transferred to the motor generator 11 via a power distribution mechanism 12, and a rotational torque from the power distribution mechanism 12 or the rotational torque generated by the motor generator 11 is transferred to wheels 15 via a transmission 13 and a differential gear 14.

On the other hand, during a regenerative braking operation, the rotational torque is transferred from the wheels 15 to the motor generator 11, and the motor generator generates alternating current (AC) power based on the transferred rotational torque. The generated AC power is converted into direct current (DC) power by a power conversion device 20 to charge a battery 21 for high voltage, and the charged power is used again as traveling energy.

The power conversion device 20 includes an inverter circuit 22 and a smoothing capacitor 23. The inverter circuit 22 is electrically connected to the battery 21 via the smoothing capacitor 23, and power is transferred between the battery 21 and the inverter circuit 22. The smoothing capacitor 23 smooths the DC power to be supplied to the inverter circuit 22.

A control circuit 24 of the power conversion device 20 receives a command from a higher-level control device via a communication connector 25 and transmits data indicating an operation state to the higher-level control device. The control circuit 24 calculates a control amount of the motor generator 11 based on the input command, generates a control signal based on the calculation result, and supplies the control signal to a gate drive circuit 26. Based on this control signal, the gate drive circuit 26 generates a drive signal for controlling the inverter circuit 22.

In a case where the motor generator 11 is operated as an electric motor, the inverter circuit 22 generates AC power based on the DC power supplied from the battery 21 and supplies the AC power to the motor generator 11. A drive mechanism including the motor generator 11 and the inverter circuit 22 is operated as an electric/power generation unit.

Figure 2:
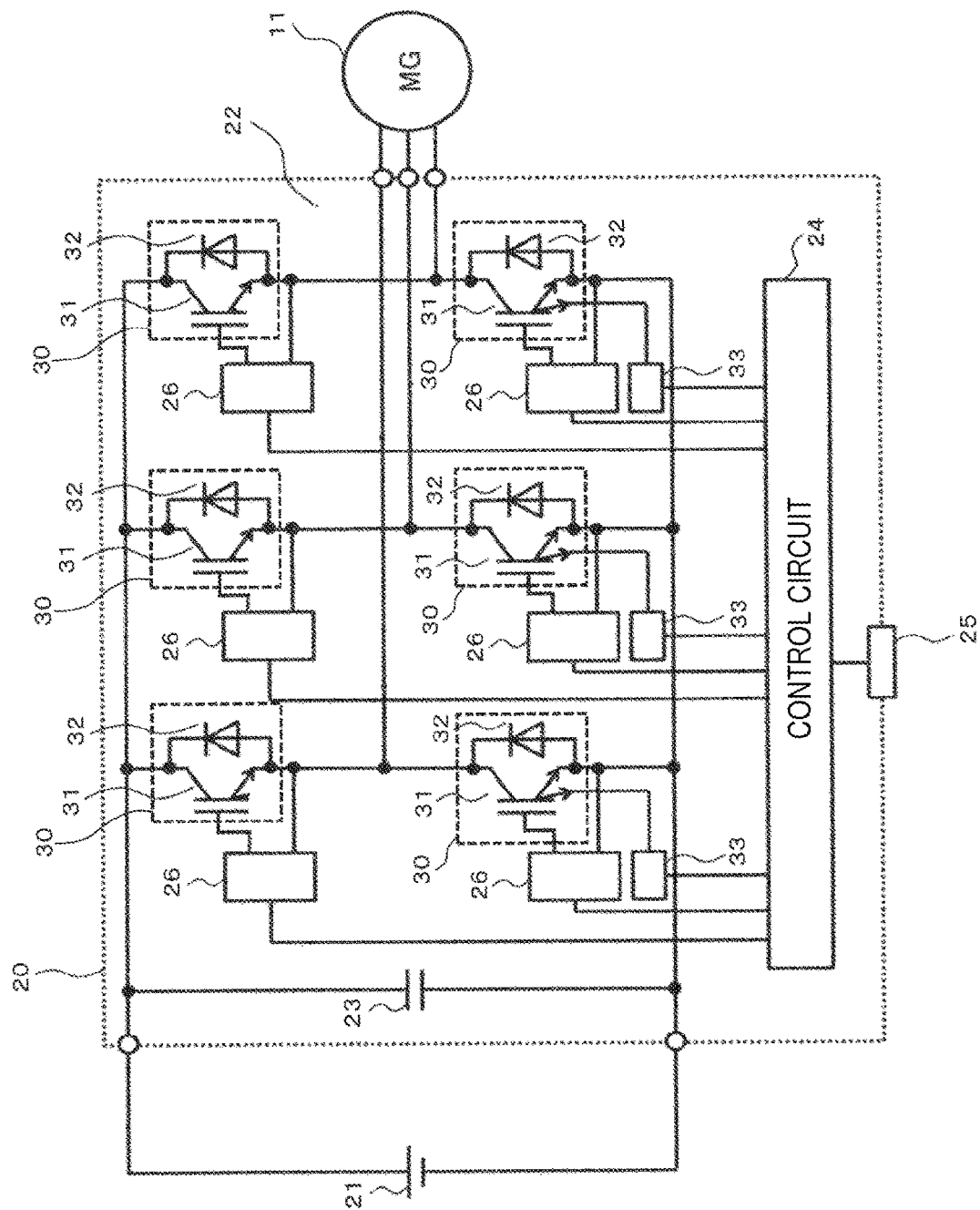
FIG. 2 is a circuit diagram illustrating a circuit configuration of a power conversion device illustrated in FIG. 1.

FIG. 2 is a diagram illustrating a circuit configuration of the power conversion device 20. In the following description, an example of a power device using a metal-oxide-semiconductor field-effect transistor (MOSFET) will be described.

The power conversion device 20 includes an upper arm and a lower arm each including a control MOSFET 31 and a diode 32 included in the power device 30, corresponding to three phases including a U phase, a V phase, and a W phase of AC power. These upper and lower arms of three phases are included in the inverter circuit 22. Here, the control MOSFET 31 may be referred to as a "main control element" in relation to a current sensing element to be described later.

A drain terminal of the control MOSFET 31 of the upper arm is electrically connected to a positive-electrode-side capacitor terminal of the smoothing capacitor 23, and a source terminal of the MOSFET 31 of the lower arm is electrically connected to a negative-electrode-side capacitor terminal of the smoothing capacitor 23. As described above, the control MOSFET 31 includes a drain terminal, a source terminal, and a gate terminal. Further, the diode 32 is electrically connected in parallel between the drain terminal and the source terminal.

The gate drive circuit 26 (see FIG. 1) is provided between the source terminal and the gate terminal of the control MOSFET 31, and performs an on-off control of the control MOSFET 31. The control circuit 24 supplies the control signal to the gate drive circuit 26.

The power device 30 of the lower arm is provided with a current sensing element for current sensing arranged in parallel with the control MOSFET 31. This current sensing element is also implemented by a MOSFET, and a sense current flowing through a source terminal thereof is input to a current sensing circuit 33. In the present embodiment, this current sensing element is referred to as a "current sensing MOSFET".

Then, a rotor speed and a magnetic pole position are calculated based on a current sensed by the current sensing circuit 33 and a voltage measured separately from the current, and a rotational torque and a rotational speed are controlled using the calculated rotor speed and magnetic pole position.

As described above, the control circuit 24 receives a control command from the higher-level control device, generates the control signal for controlling the power devices 30 included in the upper arm and the lower arm of the inverter circuit 22 based on the control command, and supplies the control signal to the gate drive circuit 26. The gate drive circuit 26 supplies the drive signal for driving the power devices 30 included in the upper arm and the lower arm of each phase to the power device 30 of each phase based on the control signal.

The control MOSFET 31 of the power device 30 is turned on or off based on the drive signal from the gate drive circuit 26 and converts the DC power supplied from the battery 21 into three-phase AC power, and the converted power is supplied to the motor generator 11.

Since the power conversion device having such a configuration is already well known, further description will be omitted.

By the way, as described above, since the power device 30 has temperature dependency, there is a problem that a current characteristic fluctuates depending on a temperature, and accurate current measurement cannot be made. For this reason, it is required to enable estimation of the temperature of the power device without using a temperature sensing diode and to accurately estimate the temperature of the current sensing element that observes the sense current.

Embodiment 1

Therefore, the present embodiment proposes a configuration in which a predetermined measurement voltage is applied between the source terminals of the control MOSFET and the current sensing MOSFET in a state in which the control MOSFET and the current sensing MOSFET are turned off, and the temperature of the power device is estimated from a current flowing between the respective source terminals of the control MOSFET and the current sensing MOSFET at the time of the application by using the fact that a resistance value of a semiconductor substrate between the source terminals of the control MOSFET and the current sensing MOSFET has temperature dependency.

As a result, it is possible to accurately estimate the temperature of the current sensing MOSFET that observes the sense current without using the temperature sensing diode by using the fact that the semiconductor substrate between the source terminals of the control MOSFET and the current sensing MOSFET has temperature dependency.

Figure 3:
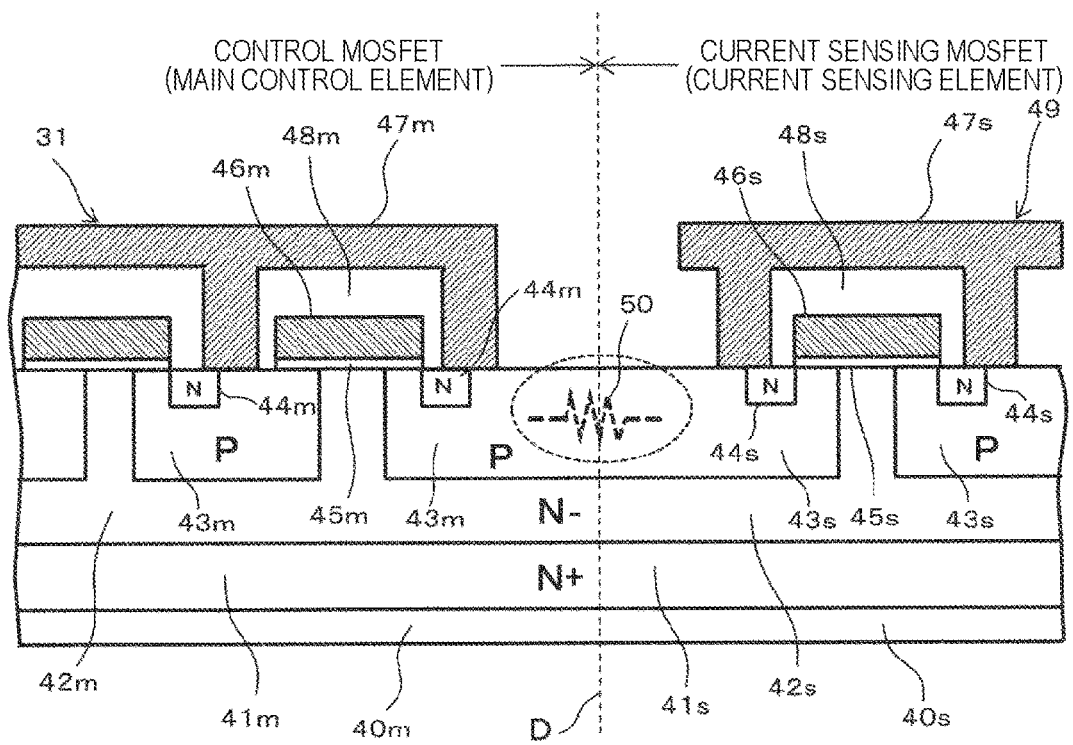
FIG. 3 is a cross-sectional view illustrating a configuration of a power device used in an embodiment of the present invention.

FIG. 3 illustrates a cross section of the power device 30 incorporating the control MOSFET 31 and a current sensing MOSFET 49. Here, the current sensing MOSFET 49 may be referred to as the "current sensing element" in relation to the main control element described above.

Hereinafter, a case where a silicon substrate is used as the semiconductor substrate will be described, but other semiconductor substrates, for example, a silicon carbide substrate may also be used. As illustrated in FIG. 3, the control MOSFET 31 and the current sensing MOSFET 49 are formed on the silicon substrate while being electrically connected to each other in parallel with a virtual division line D as a boundary.

Drain electrodes 40m and 40s are provided on the silicon substrate, N+ layers 41m and 41s are formed on the drain electrodes 40m and 40s, respectively, and N− layers 42m and 42s are further formed on the N+ layer, respectively.

P layers 43m and 43s are formed in the N− layers 42m and 42s, respectively. N layers 44m and 44s are formed in the P layers 43m and 43s, respectively. Gate oxide films 45m and 45s are formed over the N− layer 42m, the P layer 43m, and the N layer 44m, and the N− layer 42s, the P layer 43s, and the N layer 44s, respectively, and further, gate electrodes 46m and 46s are formed on the gate oxide films 45m and 45s, respectively. Source electrodes 47m and 47s that are in ohmic contact are formed on the P layer 43m and the N layer 44m, and the P layer 43s and the N layer 44s, respectively. The source electrodes 47m and 47s and the gate oxide films 45m and 45s are insulated and separated from each other by insulating films 48m and 48s, respectively. Here, the N+ layers 41m and 41s and the drain electrodes 40m and 40s are in ohmic contact.

In this manner, the control MOSFET 31 is formed of the drain electrode 40m, the N+ layer 41m, the N− layer 42m, the gate oxide film 45m, the gate electrode 46m, the insulating film 48m, and the source electrode 47m. Similarly, the current sensing MOSFET 49 is formed of the drain electrode 40s, the N+ layer 41s, the N− layer 42s, the gate oxide film 45s, the gate electrode 46s, the insulating film 48s, and the source electrode 47s. Note that an electrode can be rephrased as a terminal according to the description.

Here, as an important configuration in the present embodiment, the source electrode 47m of the control MOSFET 31 and the source electrode 47s of the current sensing MOSFET are electrically connected by the P layer 43*m* on the control MOSFET 31 side and the P layer 43*s* on the current sensing MOSFET 49 side. That is, the P layer 43*m* on the control MOSFET 31 side and the P layer 43*s* on the current sensing MOSFET 49 side are formed as a common P layer.

Therefore, the P layer formed of the semiconductor substrate and having temperature dependency is formed between the source electrode 47*m* of the control MOSFET 31 and the source electrode 47*s* of the current sensing MOSFET 49, such that the respective source electrodes 47*m* and 47*s* are connected by a temperature-dependent resistor 50. Hereinafter, the temperature-dependent resistor 50 is referred to as a "body resistor 50" for convenience of description.

Figure 4:
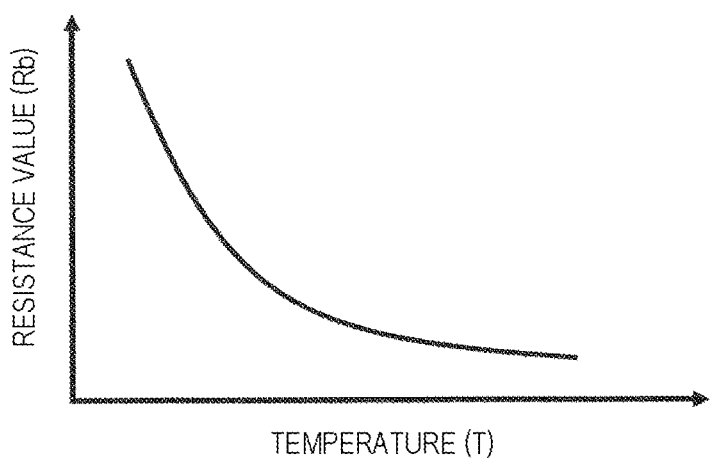
FIG. 4 is a characteristic diagram illustrating a relationship of a resistance and a temperature between source terminals of a current sensing element and a main control element illustrated in FIG. 3.

FIG. 4 illustrates a relationship of a resistance value (Rb) with respect to a temperature (T) of the body resistor 50 formed of the P layers 43*m* and 43*s* themselves, which has a negative characteristic in which the resistance value is decreased as the temperature increases. As a result, the temperature of the current sensing MOSFET 49 can be accurately estimated.

Next, a configuration, in which the temperature of the power device 30 is estimated using the body resistor 50 to perform main current temperature correction, will be described.

Figure 5:
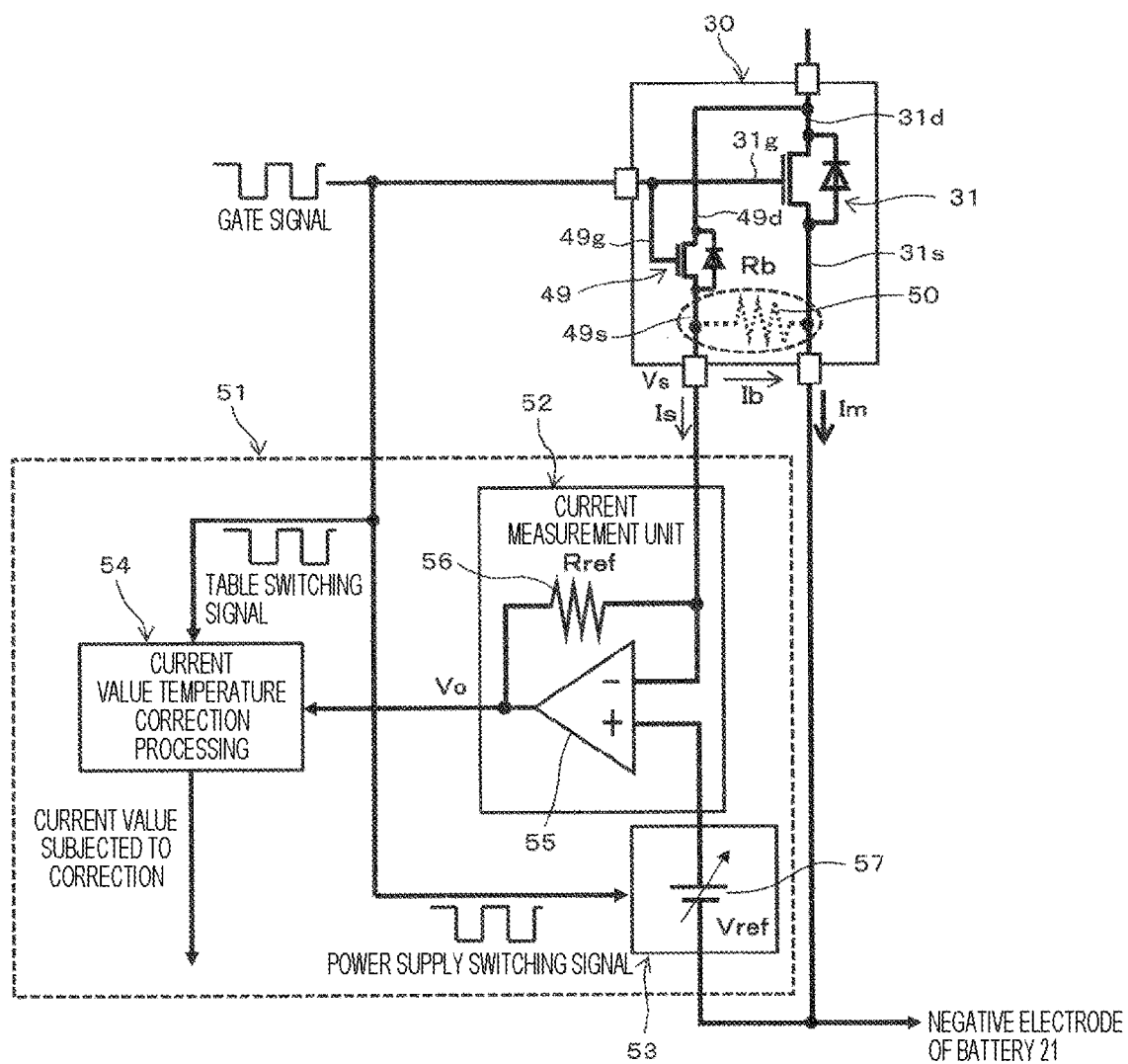
FIG. 5 is a circuit diagram illustrating a configuration of a main current sensing unit according to a first embodiment of the present invention.

FIG. 5 illustrates a circuit configuration of a main current sensing unit provided in the lower arm of one phase, and similar main current sensing units are provided in the lower arms of other phases. Therefore, since operations of the main current sensing units of all the lower arms are the same, the circuit configuration and operation of the main current sensing unit will be representatively described with reference to FIG. 5.

In FIG. 5, in the power device 30, the control MOSFET 31 and the current sensing MOSFET 49 are formed, and these MOSFETs 31 and 49 are electrically connected in parallel. Therefore, when an on signal of a gate signal is applied to the gates of the control MOSFET 31 and the current sensing MOSFET 49, a main current (Im) flows through the control MOSFET 31, and a divided sense current (Is) flows through the current sensing MOSFET 49.

The control MOSFET 31 includes a drain terminal 31*d* connected to the upper arm and a coil of one phase of the motor generator 11, a gate terminal 31*g* to which the gate signal is input, and a source terminal 31*s* connected to a negative electrode of the battery 21.

Similarly, the current sensing MOSFET 49 includes a drain terminal 49*d* connected to the drain terminal 31*d* of the control MOSFET 31, a gate terminal 49*g* to which the gate signal is input, and a source terminal 49*s* connected to the negative electrode of the battery 21.

Further, the source terminal 31*s* of the control MOSFET 31 and the source terminal 49*s* of the current sensing MOSFET are both connected to the negative electrode of the battery 21. Further, the body resistor 50 is connected between the source terminal 31*s* of the control MOSFET 31 and the source terminal 49*s* of the current sensing MOSFET 49. As described above with reference to FIG. 3, the body resistor 50 is formed of the P layers 43*m* and 43*s* themselves of the silicon substrate, and has the resistance value (Rb) dependent on the temperature (See FIG. 4). Here, a main current sensing unit 51 is provided between the source terminal 49*s* of the current sensing MOSFET 49 and the negative electrode of the battery 21. The main current sensing unit 51 includes at least a current measurement unit 52, a measurement voltage switching unit 53, and a main current temperature correction unit 54. Here, the main current temperature correction unit 54 has a function of performing temperature correction by table conversion processing using a conversion table built in a microcomputer.

The current measurement unit 52 includes an operational amplifier 55 and a parallel resistor (feedback resistor) 56 connecting an output side and an inverting input (−) side of the operational amplifier 55 in parallel, and the inverting input (−) side is connected to the source terminal 49*s* of the current sensing MOSFET 49. The parallel resistor 56 has a resistance value (Rref).

Meanwhile, a non-inverting input (+) side of the operational amplifier 55 is connected to the measurement voltage switching unit 53. The measurement voltage switching unit 53 applies a measurement voltage (Vref) from a measurement power supply 57 to the current measurement unit 52 in response to switching of the gate signal input to the power device 30. The measurement voltage switching unit will be described later. Further, an output of the current measurement unit 52 is an output voltage (Vo) output from the output side of the operational amplifier 55. The main current (Im) can be estimated from the sense current (Is) by using the output voltage (Vo).

Figure 6:
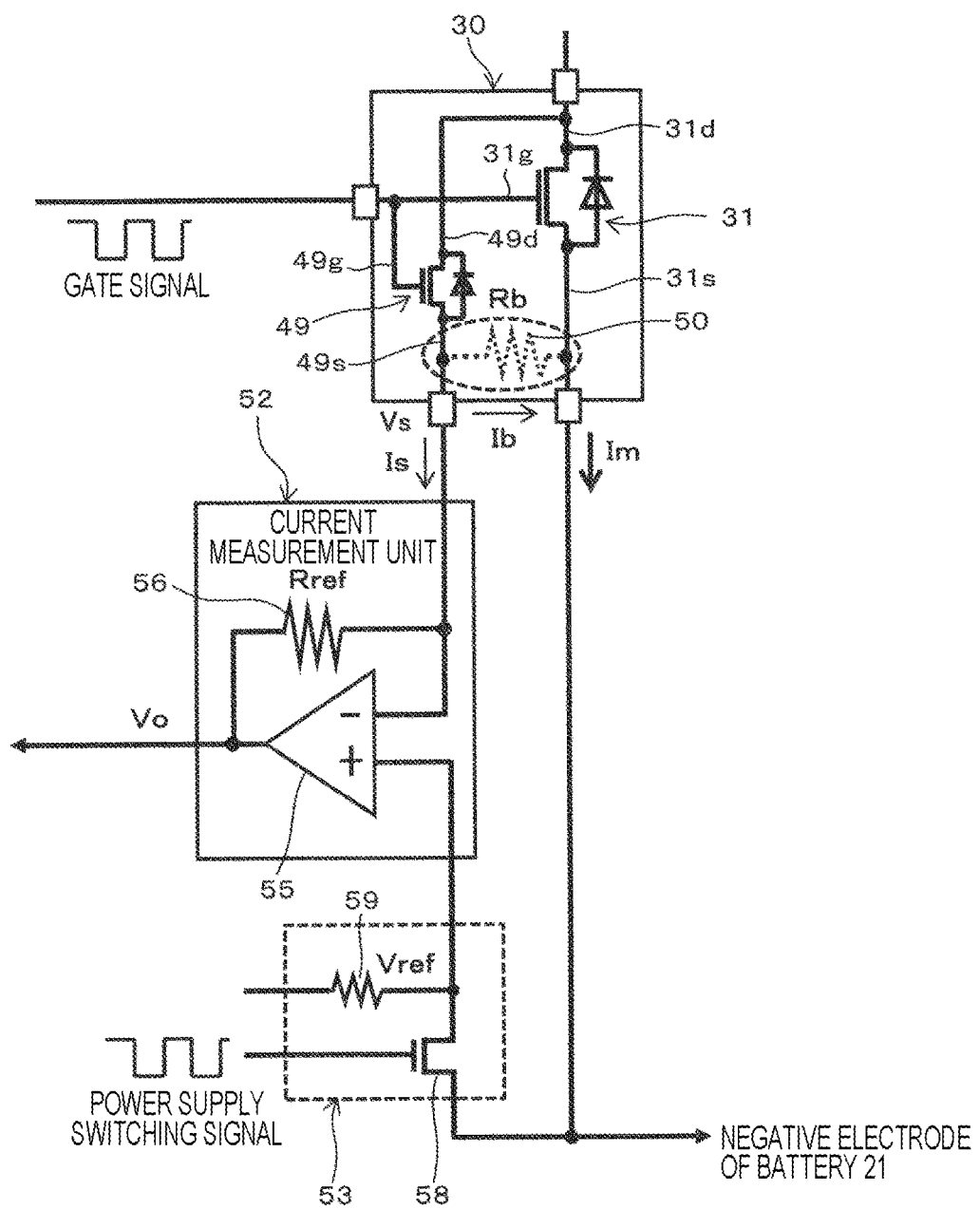
FIG. 6 is a circuit diagram illustrating a configuration of a power supply switching unit illustrated in FIG. 5.

Although an example of the measurement voltage switching unit 53 is illustrated in FIG. 6, the present embodiment is not limited thereto, and various voltage switching units can be used. For example, as illustrated in FIG. 6, the measurement voltage switching unit 53 is connected between the non-inverting input (+) side of the operational amplifier 55 of the current measurement unit 52 and the negative electrode of the battery 21, and a power supply switching switch 58 including a field-effect transistor (FET) is disposed in the middle. The power supply switching switch 58 is turned on and off by a power supply switching signal corresponding to the gate signal input to the power device 30. The power supply switching switch 58 is made conductive when the power supply switching signal is in an on state, and the power supply switching switch 58 is made non-conductive when the power supply switching signal is in an off state.

In addition, between the non-inverting input (+) side of the operational amplifier 55 and the power supply switching switch 58, a current from the battery 21 is applied to a resistor 59, and the measurement voltage (Vref) is supplied. Therefore, when the power supply switching switch 58 is made conductive, the measurement voltage (Vref) is not applied to the current measurement unit 52, and when the power supply switching switch 58 is made non-conductive, the measurement voltage (Vref) is applied to the current measurement unit 52.

The main current temperature correction unit 54 also has a function of switching the conversion table by a table switching signal corresponding to the gate signal input to the power device 30. That is, the main current temperature correction unit 54 has a function of estimating the temperature of the power device 30 from the output voltage (Vo) of the current measurement unit 52 by using the temperature conversion table in a case where a temperature sensing mode is executed.

Similarly, in a case where a current sensing mode is executed, the main current (Im) flowing through the control MOSFET 31 is estimated from the sense current (Is) flowing through the current sensing MOSFET 49 based on the output voltage (Vo) of the current measurement unit 52 by using the current conversion table.

Further, the main current temperature correction unit 54 has a function of performing temperature correction on the main current (Im) by reflecting the temperature estimated in the temperature sensing mode. Note that details of the main current temperature correction unit 54 will be described later.

Figure 7:
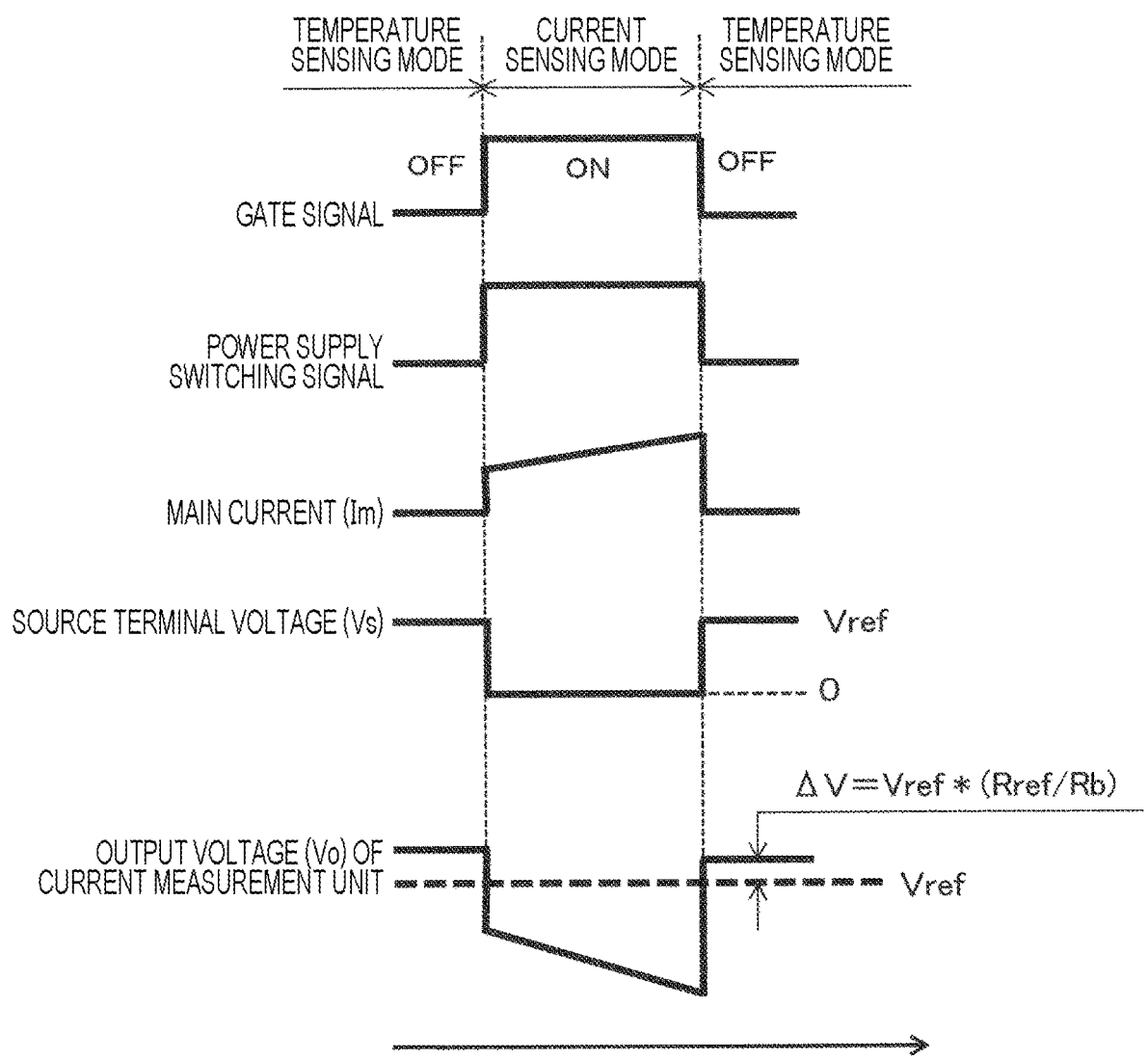
FIG. 7 is an explanatory diagram for describing operations in a temperature sensing mode and a current sensing mode.

Next, an operation of the main current sensing unit 51 illustrated in FIG. 5 will be described. In a basic operation of the main current sensing unit 51, when the gate signal turns on the power device 30, the current sensing mode is executed to estimate a current value (including temperature correction) of the main current, and when the gate signal turns off the power device 30, the temperature sensing mode is executed to estimate the temperature of the power device 30. FIG. 7 illustrates changes of main parameters of the main current sensing unit 51 when the current sensing mode and the temperature sensing mode are executed in synchronization with on and off of the gate signal.

First, the usual current sensing mode will be described with reference to FIGS. 5, 6, and 7. In a state in which the gate signal is in an on state, the control MOSFET 31 and the current sensing MOSFET 49 are turned on, the main current (Im) flows through the control MOSFET 31, and the sense current (Is) flows through the current sensing MOSFET 49.

In addition, as illustrated in FIG. 6, since the power supply switching signal makes the power supply switching switch 58 conductive in synchronization with the gate signal input to the power device 30, the measurement voltage (Vref) is not applied to the current measurement unit 52. Therefore, as illustrated in FIG. 7, in the current sensing mode, the main current (Im) behaves in accordance with the operation of the control MOSFET 31. At this time, a voltage (Vs) of the source terminal 49s of the current sensing MOSFET 49 is 0 volt. Note that, in this state, since a voltage difference across the body resistor 50 is 0 volt, the presence of the body resistor 50 can be ignored. That is, the presence of the body resistor 50 does not deteriorate accuracy in sensing the sense current (Is).

Here, the sense current (Is) flowing through the current sensing MOSFET 49 is sensed by the current measurement unit 52. Since an input impedance of the operational amplifier 55 is high, the sense current (Is) hardly flows on the inverting input (−) side, and the sense current (Is) flows in the parallel resistor 56, such that the output voltage (Vo) is "Vo=Is*Rref".

Note that, as illustrated in FIG. 7, the output voltage (Vo) is shown in a negative direction because the inverting input (−) side of the operational amplifier 55 is set as an input. Note that in a case where the output voltage (Vo) needs to be set as a positive side, it is only required to invert the output. Then, the output voltage (Vo) is input to the main current temperature correction unit 54 in the subsequent stage.

Next, the temperature sensing mode will be described with reference to FIGS. 5, 6, and 7. In a state in which the gate signal is in an off state, the control MOSFET 31 and the current sensing MOSFET 49 are turned off, the main current (Im) does not flow through the control MOSFET 31, and similarly, the sense current (Is) does not flow through the current sensing MOSFET 49. Note that, in this state, since the control MOSFET 31 and the current sensing MOSFET are turned off, the body resistor 50 functions as described below.

As illustrated in FIG. 6, since the power supply switching signal makes the power supply switching switch 58 non-conductive in synchronization with the gate signal of the power device 30, the measurement voltage (Vref) is applied to the current measurement unit 52. Therefore, in the temperature sensing mode, a current based on the measurement voltage (Vref) flows to the negative electrode of the battery 21 through the current measurement unit 52, the source terminal 49s of the current sensing MOSFET 49, the body resistor 50, and the source terminal 31s of the control MOSFET 31. Here, since the body resistor 50 has temperature dependency as described above, a flowing body current (Ib) also has temperature dependency.

At this time, as illustrated in FIG. 7, the terminal voltage (Vs) of the source terminal 49s of the current sensing MOSFET 49 is "Vref". That is, the inverting input (−) side and the non-inverting input (+) side of the operational amplifier 55 are the measurement voltage (Vref) by an imaginary short. Therefore, as illustrated in FIG. 7, the terminal voltage (Vs) of the source terminal 49s of the current sensing MOSFET 49 is also the measurement voltage (Vref).

Here, the body current (Ib) flowing through the body resistor 50 is sensed by the current measurement unit 52. Focusing on the body resistor 50, "Vref=Rb*Ib". Here, "Rb" is a resistance value of the body resistor 50. In addition, since a current hardly flows on the inverting input (−) side and the non-inverting input (+) side of the operational amplifier 55, the current flowing through the parallel resistor 56 is also the body current (Ib).

Therefore, the output voltage (Vo) of the operational amplifier 55 is obtained by adding the voltages based on the parallel resistor 56 and the body resistor 50, that is, "Vo=Rb*Ib+Rref*Ib". Then, the output voltage (Vo) is input to the main current temperature correction unit 54 in the subsequent stage. As described above, since the body current (Ib) has temperature dependency, the output voltage (Vo) of the operational amplifier 55 also has temperature dependency.

For example, the following can be understood from the above two equations. Vref=Rb*Ib . . . (1)

$$Vo=Rb*Ib+Rref*Ib \qquad (2)$$

Here, Ib=Vref/Rb based on Equation (1).
Next, Equation (2) is expressed as follows.

$$Vo=Vref+Rref*Vref/Rb$$

Then, a difference (ΔV) between the output voltage and the measurement voltage (Vref) caused by a temperature change is calculated as follows.

$$\Delta V=Vo-Vref=Vref*Rref/Rb \qquad (3)$$

Therefore, as can be seen from Equation (3) and the output voltage (Vo) of FIG. 7, the difference between the output voltage (Vo) and the measurement voltage (Vref) is a voltage change (current change) corresponding to a temperature change, which is caused by the resistance value (Rb) of the body resistor 50 having temperature dependency. The output voltage (Vo) of the current measurement unit 52 is input to the main current temperature correction unit 54 in the subsequent stage.

Here, as illustrated in FIG. 4, the resistance value (Rb) of the body resistor 50 is increased as the temperature is decreased. Therefore, the value of "Rref/Rb" in Equation (3) is decreased, and the difference (Vo−Vref) of the output voltage corresponding to the temperature change is also decreased.

Therefore, by making the resistance value (Rref) of the parallel resistor 56 variable (increasing the resistance value (Rref) as the temperature is decreased), a sufficient difference (Vo−Vref) of the output voltage can be obtained.

That is, an amplification factor (Vo/Vref) of the current measurement unit 52 can be increased. Note that the resistance value (Rref) of the parallel resistor 56 can be changed by switching a plurality of resistors.

Since the temperature sensing mode described above is executed during a period in which the control MOSFET 31 and the current sensing MOSFET 49 are turned off, the temperature sensing mode is executed exclusively from the current sensing mode with a necessary and sufficient condition that the current sensing mode is to be executed during a period in which the control MOSFET 31 and the current sensing MOSFET 49 are turned on. That is, in the configuration of the present invention, the configuration and operation for temperature sensing do not interfere with the current sensing mode, and accuracy in observation of the sense current (Is) is not impaired.

Figure 8:
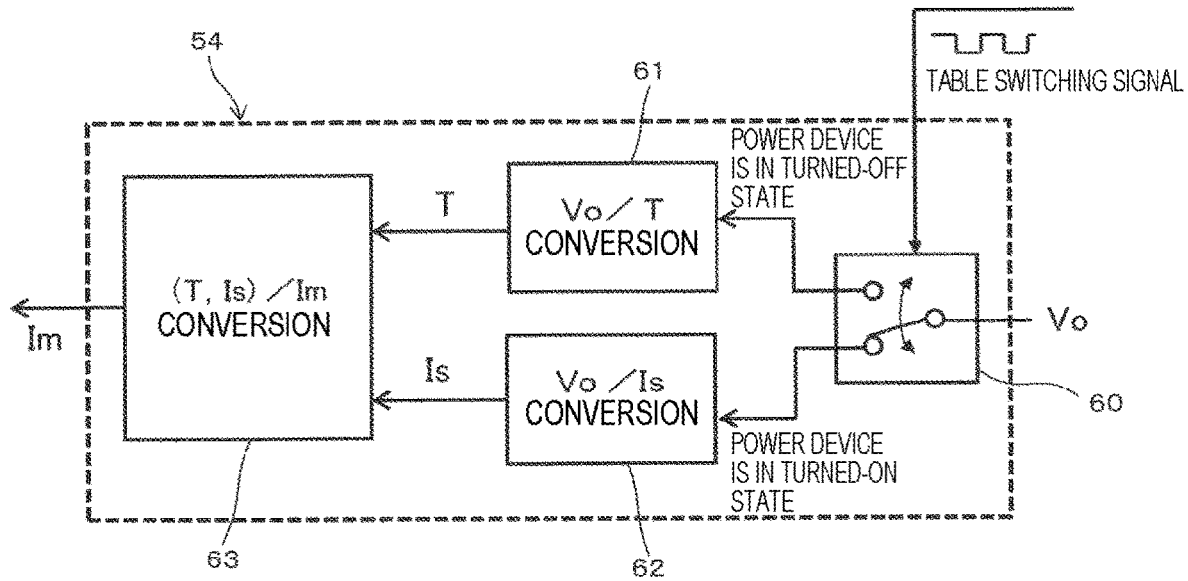
FIG. 8 is an explanatory diagram for describing obtaining of a main current subjected to temperature correction from an output voltage of a current measurement unit.

In the main current temperature correction unit 54, temperature correction is performed by a control function of the microcomputer, and the output voltage (Vo) is input to an analog/digital (A/D) converter of an input/output circuit. A temperature correction function of the microcomputer performs a control as illustrated in FIG. 8. Note that, although the control is actually performed by a control program, a control function block will be described below.

First, when the table switching signal synchronized with the gate signal of the power device 30 is input, a switching function unit 60 takes in the output voltage (Vo) in the temperature sensing mode or the output voltage (Vo) in the current sensing mode. In the temperature sensing mode, since the power device 30 is in a turned-off state as described above, the switching function unit 60 executes a function of controlling a voltage/temperature conversion function unit 61. On the other hand, in the current sensing mode, since the power device 30 is in a turned-on state as described above, the switching function unit 60 executes a function of controlling a voltage/current conversion function unit 62.

Figure 9:
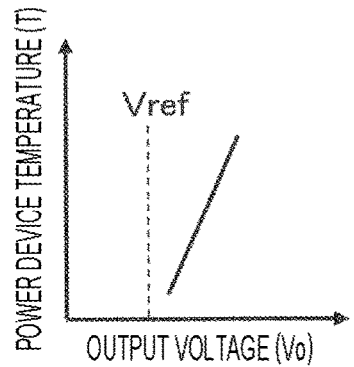
FIG. 9 is an explanatory diagram for describing a relationship between the output voltage of the current measurement unit and a temperature of the power device.

For example, in a case where the temperature sensing mode is selected, the switching function unit 60 executes the function of controlling the voltage/temperature conversion function unit 61 to estimate the temperature (T) of the power device 30 from the output voltage (Vo). The output voltage (Vo) in the temperature sensing mode has temperature dependency as described above. Therefore, the temperature (T) of the power device 30 can be estimated from the output voltage (Vo) on the basis of a voltage/temperature conversion table having a conversion characteristic as illustrated in FIG. 9. Note that the voltage/temperature conversion table illustrated in FIG. 9 schematically shows a relationship between the output voltage (Vo) and the temperature (T).

The voltage/temperature conversion table is a conversion table determined by the characteristics of the body resistor 50 and the current measurement unit 52. In the voltage/temperature conversion table, a horizontal axis represents the output voltage (Vo), and a vertical axis represents the temperature (T) of the power device 30. Note that a broken line indicates the measurement voltage (Vref). Further, the temperature of the power device 30 is increased as the output voltage (Vo) is increased (=the body resistance (Rb) is decreased).

Here, the characteristic of the voltage/temperature conversion table may be an experimentally obtained characteristic, a characteristic obtained by simulation, or a characteristic obtained by a conversion formula. Information on the temperature (T) obtained by the voltage/temperature conversion function unit 61 is used by a sense current/main current conversion function unit 63 in the subsequent stage.

Next, in a case where the current sensing mode is selected, the switching function unit 60 executes the function of controlling the voltage/current conversion function unit 62 to estimate the sense current (Is) flowing through the current sensing MOSFET 49 from the output voltage (Vo). Note that the output voltage (Vo) at this time is not affected by the body resistor 50.

Figure 10:
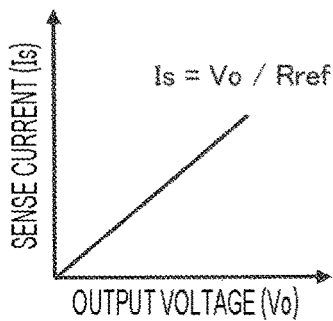
FIG. 10 is an explanatory diagram for describing a relationship between the output voltage of the current measurement unit and a sense current.

Therefore, the sense current (Is) flowing through the current sensing MOSFET 49 can be estimated from the output voltage (Vo) on the basis of the voltage/current conversion table having a conversion characteristic as illustrated in FIG. 10. Note that the voltage/temperature conversion table illustrated in FIG. 10 also schematically shows a relationship between the output voltage (Vo) and the sense current (Is).

The voltage/current conversion table is a conversion table determined by the characteristic of the current measurement unit 52. In the voltage/current conversion table, a horizontal axis represents the output voltage (Vo), and a vertical axis represents the sense current (Is) flowing through the current sensing MOSFET 49.

As described above, the sense current (Is) can be obtained from the relationship of "Vo=Is*Rref". That is, since the output voltage (Vo) is measured and the resistance value (Rref) of the parallel resistor 56 is known, the sense current (Is) can be obtained. Therefore, the sense current (Is) flowing through the current sensing MOSFET 49 is increased as the output voltage (Vo) is increased.

Information on the sense current (Is) obtained by the voltage/current conversion function unit 62 is used by the sense current/main current conversion function unit 63 in the subsequent stage. Note that the characteristic of the voltage/current conversion table may be an experimentally obtained characteristic, a characteristic obtained by simulation, or a characteristic obtained by a conversion formula.

Next, the sense current/main current conversion function unit 63 executes a control function of estimating the main current (Im) from the information on the sense current (Is). Since a division ratio between the currents flowing through the control MOSFET 31 and the current sensing MOSFET 49 is determined in advance, the main current (Im) can be estimated if the sense current (Is) is known.

Figure 11:
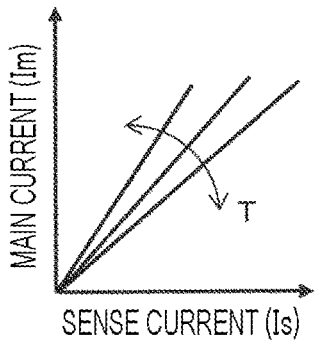
FIG. 11 is an explanatory diagram for describing a relationship between a sense current of a current sensing metal-oxide-semiconductor field-effect transistor (MOSFET) and a main current of a control MOSFET.

Therefore, the main current flowing through the control MOSFET 31 can be estimated from the sense current (Is) flowing through the current sensing MOSFET 49 on the basis of a sense current/main current conversion table having a conversion characteristic as illustrated in FIG. 11. The sense current/main current conversion table illustrated in FIG. 11 also schematically shows a relationship between the sense current (Is) and the main current (Im).

The sense current/main current conversion table is a conversion table determined by the characteristics of the current sensing MOSFET 49 and the control MOSFET 31. In the sense current/main current conversion table, a horizontal axis represents the sense current (Is), and a vertical axis represents the main current (Im).

Further, when the main current (Im) is obtained from the sense current (Is), the temperature correction can be performed on the main current (Im) by the information on the temperature (T) of the power device 30 obtained by the voltage/temperature conversion function unit 61. For example, FIG. 11 illustrates an example in which the current characteristic indicating the relationship between the sense current (Is) and the main current (Im) is corrected by the temperature (T), and an inclination of the current characteristic is corrected by the temperature (T).

Alternatively, the sense current (Is) can be multiplied by a temperature correction coefficient corresponding to the temperature (T), and the main current (Im) can be obtained from the sense current (Is) subjected to the temperature correction. Furthermore, the main current (Im) can be obtained by multiplying the main current (Im) obtained from the sense current (Is) by a temperature correction coefficient corresponding to the temperature (T) to perform the temperature correction on the main current (Im).

Note that, although the voltage/temperature conversion table, the voltage/current conversion table, and the sense current/main current conversion table described above are different conversion tables, they may be integrated.

Meanwhile, in the above-described embodiment, the main current sensing unit 51 used for the vector control has been described, but the present embodiment can also be applied to an overcurrent sensing device that senses an overcurrent flowing through the power device 30 to protect the power device 30.

As described above, in the present embodiment, the measurement voltage is applied between the source terminals of the control MOSFET and the current sensing MOSFET in a state in which the control MOSFET and the current sensing MOSFET are turned off, and the temperature of the power device is estimated from the current flowing between the respective source terminals of the main control MOSFET and the current sensing MOSFET at the time of the application by using the fact that the resistance value of the semiconductor substrate between the source terminals of the control MOSFET and the current sensing MOSFET has temperature dependency.

With this configuration, it is possible to accurately estimate the temperature of the current sensing element without otherwise using a temperature sensing diode and without hindering the observation of the sense current.

Embodiment 2

Next, a second embodiment of the present invention will be described. The second embodiment proposes a configuration in which a temperature of a power device 30 is estimated using a constant current source.

Figure 12:
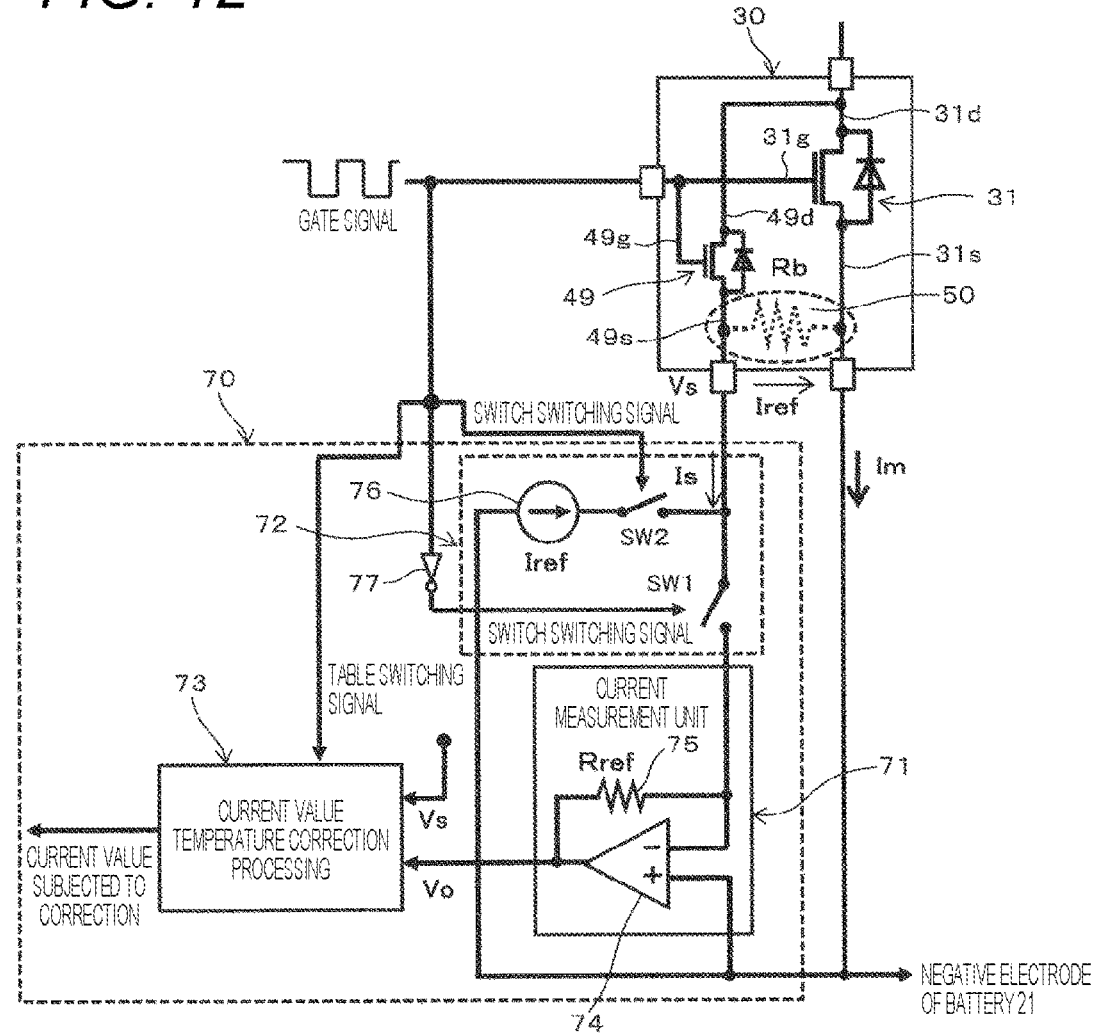
FIG. 12 is a circuit diagram illustrating a configuration of a main current sensing unit according to a second embodiment of the present invention.

FIG. 12 also illustrates a circuit configuration of a main current sensing unit provided in a lower arm of one phase, and similar main current sensing units are provided in lower arms of other phases. Therefore, since operations of the main current sensing units of all the lower arms are the same, the circuit configuration and operation of the main current sensing unit will be representatively described with reference to FIG. 12.

In FIG. 12, since the configuration of the power device 30 is similar to that of the first embodiment, a description thereof is omitted. Further, a main current sensing unit 70 is provided between a source terminal 49s of a current sensing MOSFET 49 and a negative electrode of a battery 21. The main current sensing unit 70 includes at least a current measurement unit 71, a constant current source switching unit 72, and a main current temperature correction unit 73. Here, the main current temperature correction unit 73 has a function of performing temperature correction by table conversion processing using a conversion table built in a microcomputer as in the first embodiment.

The current measurement unit 71 includes an operational amplifier 74 and a parallel resistor (feedback resistor) 75 connecting an output side and an inverting input (−) side of the operational amplifier 74 in parallel, and the inverting input (−) side is connected to the source terminal 49s of the current sensing MOSFET 49. The parallel resistor 75 has a resistance value (Rref). Further, an output of the current measurement unit 71 is an output voltage (Vo) output from the output side of the operational amplifier 74. The main current (Im) can be estimated from the sense current (Is) by using the output voltage (Vo).

The constant current source switching unit 72 includes a constant current source 76, a first switching switch SW1, and a second switching switch SW2. Here, the two switching switches SW1 and SW2 are implemented by semiconductor elements such as FETs.

The first switching switch SW1 is connected between the inverting input (−) side of the operational amplifier 74 of the current measurement unit 71 and the source terminal 49s of the current sensing MOSFET 49. The constant current source 76 is connected between the source terminal 49s of the current sensing MOSFET 49 and the first switching switch SW1. Note that the constant current source 76 is configured to make a constant current (Iref) selectively flow to the source terminal 49s of the current sensing MOSFET 49 by the second switching switch SW2. This will be described later.

Here, the first switching switch SW1 and the second switching switch SW2 are operated by a switch switching signal corresponding to a gate signal input to the power device 30, and the first switching switch SW1 and the second switching switch SW2 are configured to perform opposite operations. For example, in a case where the first switching switch SW1 and the second switching switch SW2 are FETs of the same type, when one switch switching signal is inverted by an inverter 77, the first switching switch SW1 and the second switching switch SW2 can perform opposite operations.

The main current temperature correction unit 73 also has a function of switching the conversion table by a table switching signal corresponding to the gate signal input to the power device 30. That is, the main current temperature correction unit 73 has a function of estimating the temperature of the power device 30 from a terminal voltage (Vs) of the source terminal 49s of the current sensing MOSFET 49 by using a temperature conversion table in a case where a temperature sensing mode is executed.

On the other hand, in a case where a current sensing mode is executed, the main current (Im) flowing through a control MOSFET 31 is estimated from the sense current (Is) flowing through the current sensing MOSFET 49 based on the output voltage (Vo) of the current measurement unit 71 by using a current conversion table. Further, the main current temperature correction unit 73 has a function of performing temperature correction on the main current (Im) by reflecting the temperature estimated in the temperature sensing mode. Note that details of the main current temperature correction unit 73 will be described later.

Figure 13:
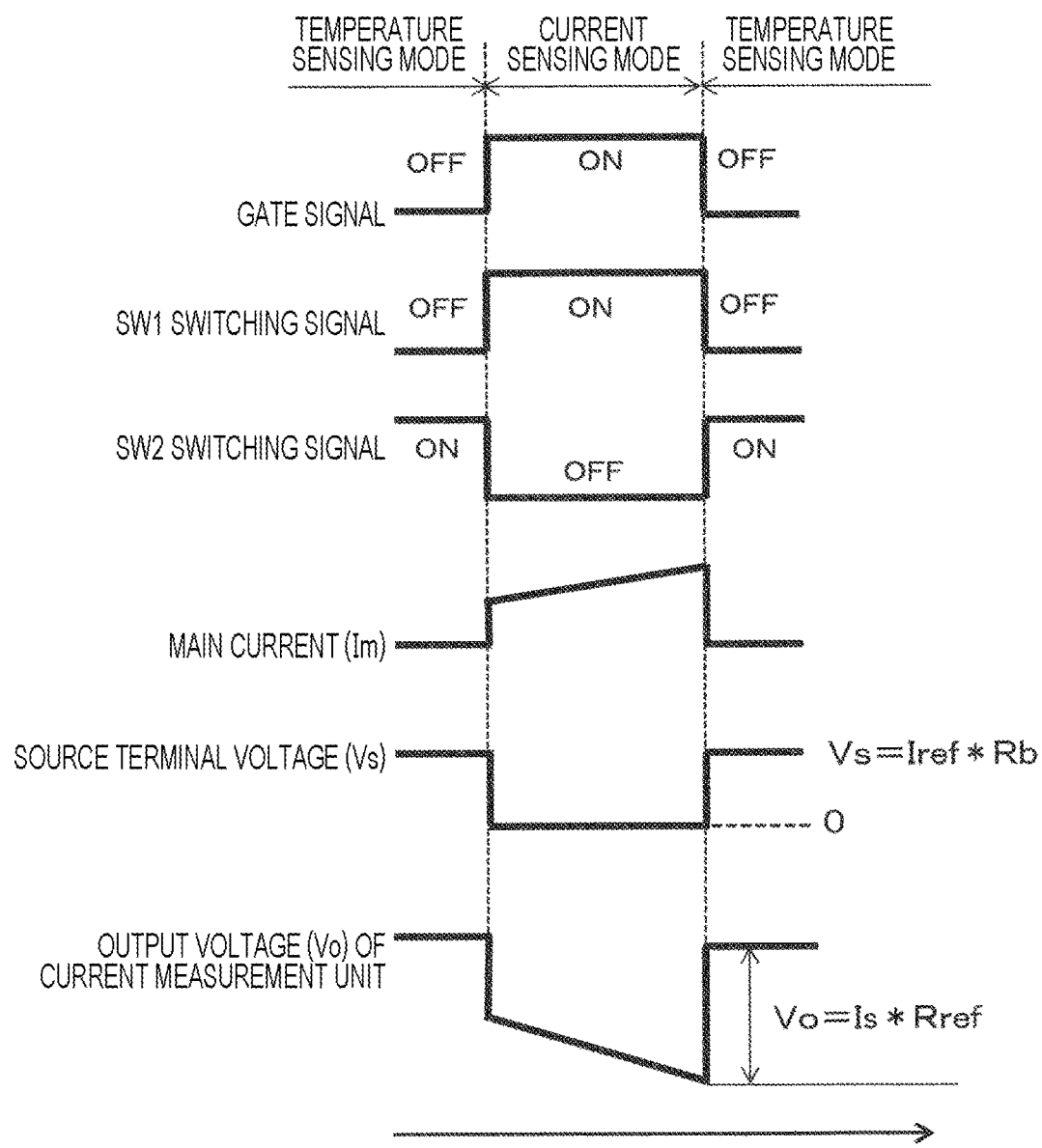
FIG. 13 is an explanatory diagram for describing operations in a temperature sensing mode and a current sensing mode.

Next, an operation of the main current sensing unit 70 illustrated in FIG. 12 will be described. In a basic operation of the main current sensing unit 70, when the gate signal turns on the power device 30, the current sensing mode is executed to estimate a current value (including temperature correction) of the main current, and when the gate signal turns off the power device 30, the temperature sensing mode is executed to estimate the temperature of the power device 30. FIG. 13 illustrates changes of main parameters of the main current sensing unit 70 when the current sensing mode and the temperature sensing mode are executed in synchronization with on and off of the gate signal.

First, the usual current sensing mode will be described with reference to FIGS. 12 and 13. In a state in which the gate signal is in an on state, the control MOSFET 31 and the current sensing MOSFET 49 are turned on, the main current (Im) flows through the control MOSFET 31, and the sense current (Is) flows through the current sensing MOSFET 49.

Note that, as described above, the presence of a body resistor 50 can be ignored in this state.

In addition, since the first switching switch SW1 is made conductive and the second switching switch SW2 is made non-conductive in synchronization with the gate signal input to the power device 30, the constant current (Iref) from the constant current source 76 does not flow to the source terminal 49s of the current sensing MOSFET 49. Therefore, as illustrated in FIG. 13, in the current sensing mode, the main current (Im) behaves in accordance with the operation of the control MOSFET 31. At this time, the terminal voltage (Vs) of the source terminal 49s of the current sensing MOSFET 49 is 0 volt.

Here, the sense current (Is) flowing through the current sensing MOSFET 49 is sensed by the current measurement unit 71. Since an input impedance of the operational amplifier 74 is high, the sense current (Is) hardly flows on the inverting input (−) side, and the sense current (Is) flows in the parallel resistor 75, such that the output voltage (Vo) is "Vo=Is*Rref".

Note that, here, as illustrated in FIG. 13, the output voltage (Vo) is shown in a negative direction because the inverting input (−) side of the operational amplifier 74 is set as an input. Note that in a case where the output voltage (Vo) needs to be set as a positive side, it is only required to invert the output. Then, the output voltage (Vo) is used by the main current temperature correction unit 54 in the subsequent stage.

Next, the temperature sensing mode will be described with reference to FIGS. 12 and 13. In a state in which the gate signal of the power device 30 is in an off state, the control MOSFET 31 and the current sensing MOSFET 49 are turned off, the main current (Im) does not flow through the control MOSFET 31, and similarly, the sense current (Is) does not flow through the current sensing MOSFET 49. Note that, in this state, since the control MOSFET 31 and the current sensing MOSFET 49 are turned off, the body resistor 50 functions as described below.

As illustrated in FIG. 12, the switch switching signal makes the first switching switch SW1 non-conductive, and makes the second switching switch SW2 conductive in synchronization with the gate signal of the power device 30. Therefore, the current measurement device 71 is cut off from the source terminal 49s of the current sensing MOSFET 49, and the constant current (Iref) flows from the constant current source 76 to the source terminal 49s of the current sensing MOSFET 49.

Therefore, in the temperature sensing mode, the constant current (Iref) based on the constant current source 76 flows to the negative electrode of the battery 21 through the source terminal 49s of the current sensing MOSFET 49, the body resistor 50, and the source terminal 31s of the control MOSFET 31. Here, as described above, since a resistance value (Rb) of the body resistor 50 has temperature dependency, the terminal voltage (Vs) between the source terminal 49s of the current sensing MOSFET 49 and the source terminal 31s of the control MOSFET 31 also has temperature dependency.

At this time, as illustrated in FIG. 13, the terminal voltage (Vs) of the source terminal 49s of the current sensing MOSFET 49 is "Vs=Iref*Rb". Here, "Rb" is a resistance value of the body resistor 50. Then, the terminal voltage (Vs) of the source terminal 49s is used by the main current temperature correction unit 73 in the subsequent stage.

Here, in a case where the value of the terminal voltage (Vs) of the source terminal 49s of the current sensing MOSFET 49 is small, the voltages of the source terminal 49s and the source terminal 31s, which are both ends of the body resistor 50, can be input to the inverting input (−) side and a non-inverting input (+) side of the voltage amplifier to be amplified. Note that the voltage of the source terminal 31s is a reference voltage.

Figure 14:
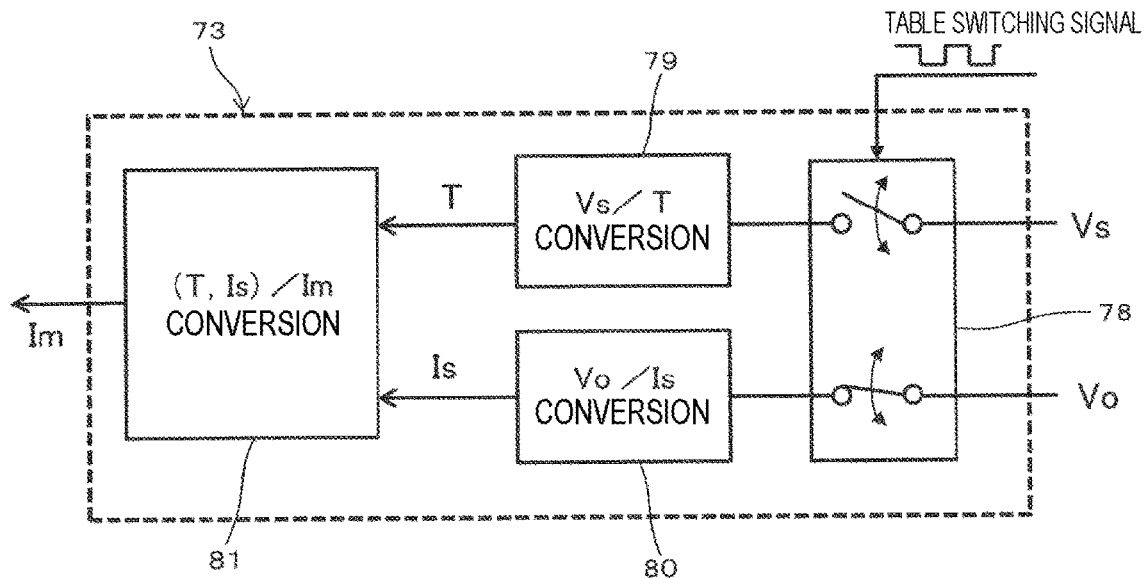
FIG. 14 is an explanatory diagram for describing obtaining of a main current subjected to temperature correction from an output of a current measurement unit.

In the main current temperature correction unit 73, temperature correction is performed by a control function of the microcomputer, and the output voltage (Vo) of the current measurement unit 71 and the terminal voltage (Vs) of the source terminal 49s of the current sensing MOSFET 49 are input to an A/D converter of an input/output circuit. A temperature correction function of the microcomputer performs a control as illustrated in FIG. 14. Note that, although the control is actually performed by a control program, a control function block will be described below.

First, when the table switching signal synchronized with the gate signal of the power device 30 is input, a switching function unit 78 takes in the terminal voltage (Vs) in the temperature sensing mode or the output voltage (Vo) in the current sensing mode.

In the temperature sensing mode, since the power device is in the turned-off state as described above, the switching function unit 78 takes in the terminal voltage (Vs) in the temperature sensing mode and does not take in the output voltage (Vo) of the current measurement unit 71. In the temperature sensing mode, a function of controlling a voltage/temperature conversion function unit 79 is executed.

On the other hand, in the current sensing mode, since the power device 30 is in the turned-on state as described above, the switching function unit 78 takes in the output voltage (Vo) in the current sensing mode, and does not take in the terminal voltage (Vs) of the source terminal 49s of the current sensing MOSFET 49. In the current sensing mode, a function of controlling a voltage/current conversion function unit 80 is executed.

For example, in a case where the temperature sensing mode is selected, the switching function unit 78 executes the function of controlling the voltage/temperature conversion function unit 79 to estimate the temperature (T) of the power device 30 from the terminal voltage (Vs). The terminal voltage (Vs) in the temperature sensing mode has temperature dependency as described above.

Figure 15:
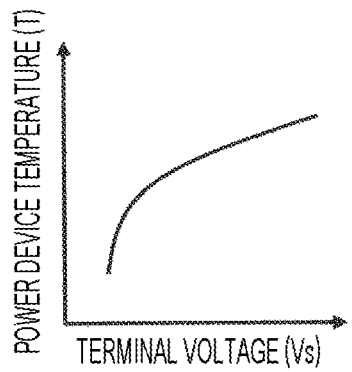
FIG. 15 is an explanatory diagram for describing a relationship between a terminal voltage of a source terminal of a current sensing MOSFET and a temperature of a power device.

Therefore, the temperature (T) of the power device 30 can be estimated from the terminal voltage (Vs) on the basis of a voltage/temperature conversion table having a conversion characteristic as illustrated in FIG. 15. Note that the voltage/temperature conversion table illustrated in FIG. 15 schematically shows a relationship between the output voltage (Vo) and the temperature (T).

The voltage/temperature conversion table is a conversion table determined by the characteristics of the body resistor 50 and the constant current source 76. In the voltage/temperature conversion table, a horizontal axis represents the terminal voltage (Vs), and a vertical axis represents the temperature (T) of the power device 30. Further, the temperature of the power device 30 is increased as the terminal voltage (Vs) is decreased (=the body resistance (Rb) is decreased) according to the characteristic in FIG. 4. Therefore, the temperature (T) of the power device 30 on the vertical axis decreases from the origin.

Note that the characteristic of the voltage/temperature conversion table may be an experimentally obtained characteristic, a characteristic obtained by simulation, or a characteristic obtained by a conversion formula. Information on the temperature (T) obtained by the voltage/temperature conversion function unit is used by a sense current/main current conversion function unit 81 in the subsequent stage.

Next, in a case where the current sensing mode is selected, the switching function unit 78 executes the function of controlling the voltage/current conversion function unit 80 to estimate the sense current (Is) flowing through the current sensing MOSFET 49 from the output voltage (Vo). Note that the output voltage (Vo) at this time is not affected by the body resistor 50.

Figure 16:
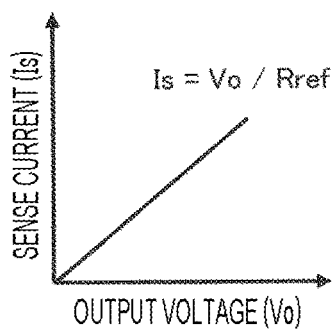
FIG. 16 is an explanatory diagram for describing a relationship between an output voltage of the current measurement unit and a sense current.

Therefore, the sense current (Is) flowing through the current sensing MOSFET 49 can be estimated from the output voltage (Vo) on the basis of a voltage/current conversion table having a conversion characteristic as illustrated in FIG. 16. Note that the voltage/temperature conversion table illustrated in FIG. 16 also schematically shows a relationship between the output voltage (Vo) and the sense current (Is).

The voltage/current conversion table is a conversion table determined by the characteristic of the current measurement unit 71. In the voltage/current conversion table, a horizontal axis represents the output voltage (Vo), and a vertical axis represents the sense current (Is) flowing through the current sensing MOSFET 49.

As described above, the sense current (Is) can be obtained from the relationship of "Vo=Is*Rref". That is, since the output voltage (Vo) is measured and the resistance value (Rref) of the parallel resistor 75 is known, the sense current (Is) can be obtained. Therefore, the sense current (Is) flowing through the current sensing MOSFET 49 is increased as the output voltage (Vo) is increased.

Information on the sense current (Is) obtained by the voltage/current conversion function unit 80 is used by the sense current/main current conversion function unit 63 in the subsequent stage. Note that the characteristic of the voltage/current conversion table may be an experimentally obtained characteristic, a characteristic obtained by simulation, or a characteristic obtained by a conversion formula.

Next, the sense current/main current conversion function unit 81 executes a control function of estimating the main current (Im) from the information on the sense current (Is). Since a division ratio between the currents flowing through the control MOSFET 31 and the current sensing MOSFET 49 is determined in advance, the main current (Im) can be estimated if the sense current (Is) is known.

Figure 17:
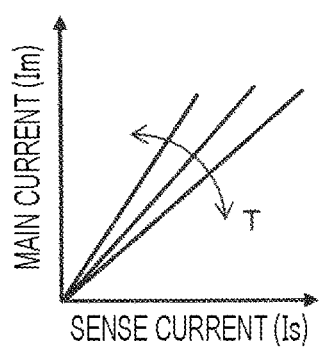
FIG. 17 is an explanatory diagram for describing a relationship between a sense current of the current sensing MOSFET and a main current of a control MOSFET.

Therefore, the main current flowing through the control MOSFET 31 can be estimated from the sense current (Is) flowing through the current sensing MOSFET 49 on the basis of a sense current/main current conversion table having a conversion characteristic as illustrated in FIG. 17. The sense current/main current conversion table illustrated in FIG. 17 also schematically shows a relationship between the sense current (Is) and the main current (Im).

The sense current/main current conversion table is a conversion table determined by the characteristics of the current sensing MOSFET 49 and the control MOSFET 31. In the sense current/main current conversion table, a horizontal axis represents the sense current (Is), and a vertical axis represents the main current (Im).

Further, when the main current (Im) is obtained from the sense current (Is), the temperature correction can be performed on the main current (Im) by the information on the temperature (T) of the power device 30 obtained by the voltage/temperature conversion function unit 79. For example, FIG. 17 illustrates an example in which the current characteristic indicating the relationship between the sense current (Is) and the main current (Im) is corrected by the temperature (T), and an inclination of the current characteristic is corrected by the temperature (T).

Alternatively, the sense current (Is) can be multiplied by a temperature correction coefficient corresponding to the temperature (T), and the main current (Im) can be obtained from the sense current (Is) subjected to the temperature correction. Furthermore, the main current (Im) can be obtained by multiplying the main current (Im) obtained from the sense current (Is) by a temperature correction coefficient corresponding to the temperature (T) to perform the temperature correction on the main current (Im).

Note that, although the voltage/temperature conversion table, the voltage/current conversion table, and the sense current/main current conversion table described above are different conversion tables, they may be integrated.

It is a matter of course that, as described in the first embodiment, the present embodiment can also be applied to an overcurrent sensing device that senses an overcurrent flowing through the power device 30 to protect the power device 30.

As described above, in the present embodiment, a predetermined constant current from the constant current source is made to flow between the source terminals of the control MOSFET and the current sensing MOSFET in a state in which the control MOSFET and the current sensing MOSFET are turned off, and the temperature of the power device is estimated from the source terminal voltage between the respective source terminals of the main control MOSFET and the current sensing MOSFET at the time of the flow of the predetermined constant current by using the fact that the resistance value of the semiconductor substrate between the source terminals of the control MOSFET and the current sensing MOSFET has temperature dependency.

With this configuration, it is possible to accurately estimate the temperature of the current sensing element that observes the sense current without using a temperature sensing diode.

In the first embodiment and the second embodiment, the power conversion device that controls the electric motor has been described, but the present invention can also be applied to other power conversion devices. For example, in a power conversion device including a MOSFET that controls a current flowing through an electromagnetic coil included in an electromagnetic drive mechanism, the present invention can also be applied to an overcurrent sensing device that senses an overcurrent flowing through the MOSFET to protect the MOSFET. Here, examples of the electromagnetic drive mechanism include an electromagnetic flow rate control valve that adjusts a control oil amount of a continuously variable transmission (CVT) provided in a vehicle, and a direct injection type fuel injection valve that directly injects fuel into a combustion chamber of an internal combustion engine.

Note that the present invention is not limited to the embodiments described above, but includes various modified examples. For example, embodiments described above have been described in detail in order to explain the present invention in an easy-to-understand manner, and the present invention is not necessarily limited to those having all the configurations described. Further, a part of a configuration of an embodiment can be replaced with a configuration of another embodiment, and to a configuration of an embodiment, a configuration of another embodiment can be added. In addition, with respect to a part of the configuration of each embodiment, another configuration can be added to, removed from, and substituted for.

REFERENCE SIGNS LIST

30 power device
31 control MOSFET 31d drain terminal
31g gate terminal
31s source terminal
49 current sensing MOSFET
49d drain terminal
49g gate terminal
49s source terminal
50 body resistor
51 main current sensing unit
52 current measurement unit
53 measurement voltage switching unit
54 main current temperature correction unit
55 operational amplifier
56 parallel resistor
57 measurement power supply
58 power supply switching switch
59 resistor
60 switching function unit
61 voltage/temperature conversion function unit
62 voltage/sense current conversion function unit
63 sense current/main current conversion function unit

The invention claimed is:

1. A power conversion device comprising:
a current sensing unit that estimates a current flowing through a power device,
wherein the power device includes at least a main control element and a current sensing element electrically connected to the main control element, the main control element and the current sensing element being formed on a semiconductor substrate, and
the current sensing unit applies a predetermined measurement voltage between source terminals of the main control element and the current sensing element in a state in which the main control element and the current sensing element are turned off, and estimates a temperature of the power device characterized based on temperature dependency of a resistance value between the respective source terminals of the main control element and the current sensing element at a time of the application and a current flowing therebetween.

2. The power conversion device according to claim 1, wherein
the main control element is formed using a metal-oxide-semiconductor field-effect transistor (hereinafter, referred to as a control MOSFET),
the current sensing element is formed using a MOSFET (hereinafter, referred to as a current sensing MOSFET), and
the source terminal of the control MOSFET and the source terminal of the current sensing MOSFET are connected by a temperature-dependent resistor (hereinafter, referred to as a body resistor) formed by the semiconductor substrate.

3. The power conversion device according to claim 2, wherein the body resistor is formed of a P layer to which the source terminal of the control MOSFET is connected and a P layer to which the source terminal of the current sensing MOSFET is connected, and
each of the P layers is a common P layer.

4. The power conversion device according to claim 2, wherein the current sensing unit executes a current sensing mode and a temperature sensing mode according to a gate signal for controlling the power device,
in the temperature sensing mode in which the gate signal is in an off state, the current sensing unit estimates the temperature of the power device based on a current flowing through the body resistor, and
in the current sensing mode in which the gate signal is in an on state, the current sensing unit estimates a main current flowing through the control MOSFET based on a sense current flowing through the current sensing MOSFET and information on the temperature of the power device.

5. The power conversion device according to claim 4, wherein the measurement voltage is applied to the source terminal of the current sensing MOSFET according to the temperature sensing mode in which the power device is turned off.

6. The power conversion device according to claim 4, wherein a current measurement unit and a measurement voltage switching unit are connected to the source terminal of the current sensing MOSFET,
the current measurement unit includes an operational amplifier and a parallel resistor connecting an output unit and an inverting input (−) side of the operational amplifier, and
the inverting input (−) side of the operational amplifier is connected to the source terminal of the current sensing MOSFET, and a non-inverting input (+) side of the operational amplifier is connected to the measurement voltage switching unit to be applied the measurement voltage.

7. The power conversion device according to claim 6, wherein a first output voltage based on a current flowing through the body resistor in the temperature sensing mode is output to the output unit of the operational amplifier, and a second output voltage based on a current flowing through the current sensing MOSFET in the current sensing mode is output to the output unit of the operational amplifier.

8. The power conversion device according to claim 7, wherein the current sensing unit includes a main current temperature correction unit,
the first output voltage and the second output voltage are input from the current measurement unit to the main current temperature correction unit, and
the main current temperature correction unit estimates the temperature of the power device from the first output voltage, estimates the sense current flowing through the current sensing MOSFET from the second output voltage, and estimates the main current flowing through the control MOSFET based on the information on the temperature of the power device and the sense current.

9. The power conversion device according to claim 6, wherein the parallel resistor connected in parallel to the operational amplifier included in the current measurement unit has a resistance value that is variable depending on the temperature of the power device.

10. The power conversion device according to claim 9, wherein the resistance value of the parallel resistor connected in parallel to the operational amplifier is set to be increased as the temperature of the power device is decreased.

11. The power conversion device according to claim 1, comprising an operational amplifier electrically connecting the current sensing unit and the power device, the operational amplifier configured to output a temperature dependent output voltage based at least in part on the temperature dependency of the resistance value.

12. A power conversion device comprising:
a current sensing unit that estimates a current flowing through a power device,
wherein the power device includes at least a main control element and a current sensing element electrically connected to the main control element, the main control element and the current sensing element being formed on a semiconductor substrate, and the current sensing unit makes a predetermined constant current from a constant current source flow between source terminals of the main control element and the current sensing element in a state in which the main control element and the current sensing element are turned off, and estimates a temperature of the power device characterized based on temperature dependency of a resistance value between the respective source terminals of the main control element and the current sensing element at a time of the flow of the predetermined constant current and a terminal voltage therebetween.

13. The power conversion device according to claim 12, wherein the main control element is formed using a metal-oxide-semiconductor field-effect transistor (hereinafter, referred to as a control MOSFET), the current sensing element is formed using a MOSFET (hereinafter, referred to as a current sensing MOSFET), and the source terminal of the control MOSFET and the source terminal of the current sensing MOSFET are connected by a temperature-dependent resistor (hereinafter, referred to as a body resistor) formed by the semiconductor substrate.

14. The power conversion device according to claim 13, wherein the current sensing unit executes a current sensing mode and a temperature sensing mode according to a gate signal for controlling the power device, in the temperature sensing mode in which the gate signal is in an off state, the current sensing unit estimates the temperature of the power device based on the body resistor and the terminal voltage determined from the constant current flowing through the body resistor, and in the current sensing mode in which the gate signal is in an on state, the current sensing unit estimates a main current flowing through the control MOSFET based on a sense current flowing through the current sensing MOSFET and information on the temperature of the power device.

15. The power conversion device according to claim 13, wherein the constant current source and a current measurement unit are connected to the source terminal of the current sensing MOSFET via a current switching unit, and the current switching unit makes the source terminal of the current sensing MOSFET and the current measurement unit non-conductive and outputs the terminal voltage between the respective source terminals of the current sensing MOSFET and the control MOSFET when the source terminal of the current sensing MOSFET and the constant current source are in a conductive state, and the current switching unit makes the source terminal of the current sensing MOSFET and the current measurement unit conductive and causes the current measurement unit to output an output voltage when the source terminal of the current sensing MOSFET and the constant current source are in a non-conductive state, according to a gate signal of the power device.

16. The power conversion device according to claim 15, wherein the current sensing unit includes a main current temperature correction unit, the terminal voltage and the output voltage are input to the main current temperature correction unit, and the main current temperature correction unit estimates the temperature of the power device from the terminal voltage, estimates a sense current flowing through the current sensing MOSFET from the output voltage, and estimates the main current flowing through the control MOSFET based on information on the temperature of the power device and the sense current.

* * * * *